United States Patent
Hu et al.

(10) Patent No.: US 12,482,702 B2
(45) Date of Patent: Nov. 25, 2025

(54) WET ETCH PROCESS AND METHODS TO FORM AIR GAPS BETWEEN METAL INTERCONNECTS

(71) Applicant: Tokyo Electron Limited, Tokyo (JP)

(72) Inventors: Shan Hu, Albany, NY (US); Eric Chih-Fang Liu, Albany, NY (US); Henan Zhang, Albany, NY (US); Sangita Kumari, Albany, NY (US); Peter Delia, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 688 days.

(21) Appl. No.: 17/942,378

(22) Filed: Sep. 12, 2022

(65) Prior Publication Data
US 2024/0087950 A1    Mar. 14, 2024

(51) Int. Cl.
H01L 21/768    (2006.01)
H01L 21/311    (2006.01)

(52) U.S. Cl.
CPC .... *H01L 21/7682* (2013.01); *H01L 21/31111* (2013.01)

(58) Field of Classification Search
CPC .................................................. H01L 21/7682
See application file for complete search history.

(56) References Cited

U.S. PATENT DOCUMENTS

| | | | |
|---|---|---|---|
| 3,979,241 A | 9/1976 | Maeda et al. | |
| 6,479,399 B2 * | 11/2002 | Park | H01L 21/76837 |
| | | | 438/738 |
| 7,361,991 B2 | 4/2008 | Saenger et al. | |
| 7,943,480 B2 | 5/2011 | Edelstein et al. | |
| 9,653,400 B2 * | 5/2017 | Yim | H01L 21/76814 |
| 9,876,075 B2 | 1/2018 | Adusumilli et al. | |
| 2008/0122106 A1 | 5/2008 | Nitta et al. | |
| 2010/0206842 A1 | 8/2010 | Gu | |
| 2011/0221062 A1 | 9/2011 | Clevenger et al. | |
| 2012/0001343 A1 | 1/2012 | Huisinga et al. | |

(Continued)

OTHER PUBLICATIONS

Ueda, "Effect Of Hydrophobicity And Surface Potential Of Silicon On SiO2 Etching In Nonometer-Sized Narrow Spaces", Trans Tech Publications, 2021, 6 pgs.

(Continued)

*Primary Examiner* — Daniel Luke
(74) *Attorney, Agent, or Firm* — Egan, Enders & Huston LLP.

(57) ABSTRACT

Embodiments of improved process flows and methods are provided in the present disclosure to form air gaps between metal interconnects. More specifically, the present disclosure provides improved process flows and methods that utilize a wet etch process to form recesses between metal interconnects formed on a patterned substrate. Unlike conventional air gap integration methods, the improved process flows and methods described herein utilize the critical dimension (CD) dependent etching provided by wet etch processes to etch an intermetal dielectric material formed between the metal interconnects at a faster rate than the intermetal dielectric material is etched in surrounding areas of the patterned substrate. This enables the improved process flows and methods described herein to form recesses (and subsequently form air gaps) between the metal interconnects without using a dry etch process.

24 Claims, 9 Drawing Sheets

(56) References Cited

U.S. PATENT DOCUMENTS

| | | | |
|---|---|---|---|
| 2012/0280398 A1 | 11/2012 | Clevenger et al. | |
| 2017/0154847 A1 | 6/2017 | Ting et al. | |
| 2018/0138053 A1 | 5/2018 | Yao et al. | |
| 2018/0166383 A1 | 6/2018 | Cao et al. | |
| 2020/0343132 A1* | 10/2020 | Jisong | H01L 21/76829 |
| 2022/0098485 A1 | 3/2022 | Vereecke | |

OTHER PUBLICATIONS

Watanabe et al., "High Selectively (SiN/SiO2) Etching Using An Organic Solution Containing Anhydroud HF", Microelectronic Engineering, 2009, 1 pg.

Okuyama et al., "Impact Of Electrostatic Effects On Wet Etching Phenomenon In Nanoscale Region", Trans Tech Publications, 2015, 5 pgs.

Polster et al., "The Electrical-Double Layer Revisted", Natural Sciences, Dec. 2021, 10 pgs.

Zubel et al., "Silicon Anisotropic Etching In Alkaline Solutions IV: The Effect Of Organic And Inorganic Agents On Silicon Anisotropic Etching Process", Sensors And Actuators A Physical, Jan. 2001, 1 pg.

MicroChemicals, "Wet-Chemical Etching Of Silicon and Sio2", Anisotropic Etching Of Silicon, Basics Of Microstructuring, Obtained from Internet Jul. 12, 2022, 7 pgs.

MicroChemicals, "Wet Chemical Etching—Basics", Basics Of Microstructuring, Obtained from Internet Jul. 12, 2022, 8 pgs.

Virginia Semiconductor, "Wet-Chemical Etching And Cleaning Of Silicon", Jan. 2003, 11 pgs.

Li et al., "Evaluation On Dispersion Behavior Of The Aqueous Copper Nano-Suspensions", Journal Of Colloid And Interface Science, Mar. 2007, 9 pgs.

Ryu et al., "Timing Critically-Aware Design Optimization Using BEOL Air Gap Technology On Consecutive Metal Layers", MDPI, Electronics, Nov. 1, 2019, 12 pgs.

Hoofman et al., "Alternatives to Low-k Nanoporous Materials: Dielectric Air-Gap Integration", Philips Research, Aug. 2006, 4 pgs.

Zygmuntowicz et al., "Microstructure And Mechanical Properties of Al2O3—Cu—Ni Hybrid Composites Fabricated By Slip Casting", Processing And Applications of Ceramics, Dec. 2019, 9 pgs.

Search Report and The Written Opinion mailed Nov. 20, 2023, Application No. PCT/US2023/029095, Filed Jul. 31, 2023, 9 pgs.

* cited by examiner

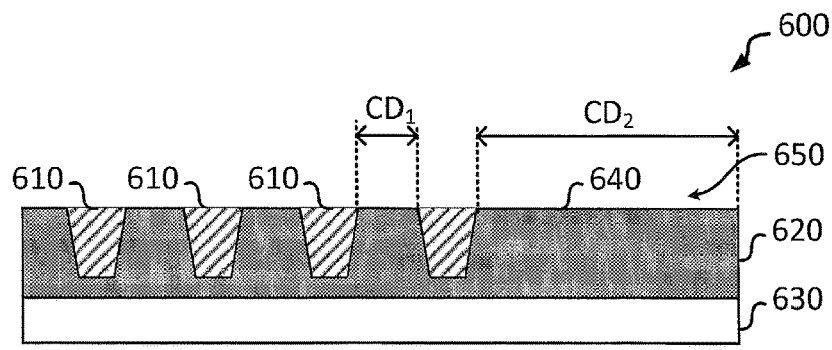

(a) Form a plurality of metal interconnects within a first IMD layer and planarize the first IMD layer to provide a first planarized surface

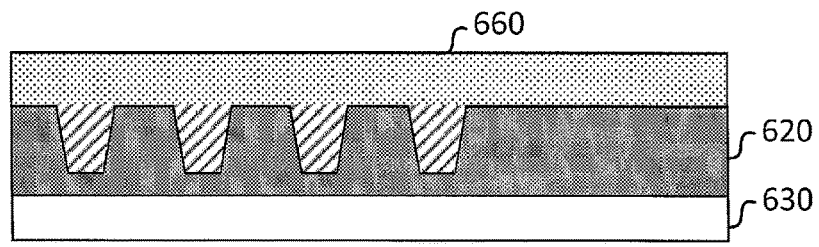

(b) Etch the first IMD layer by exposing the patterned substrate to an etch solution

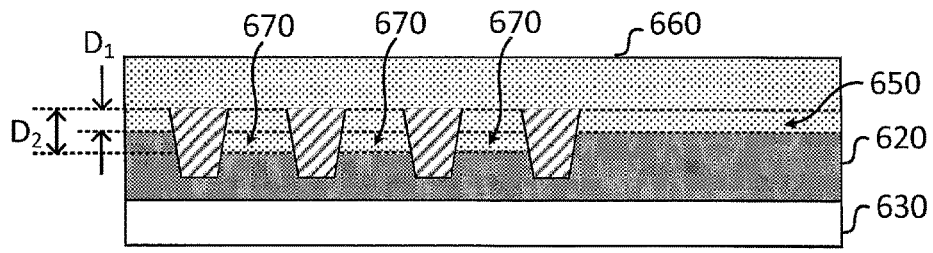

(c) Continue etching the first IMD layer with the etch solution to form recesses between the metal interconnects

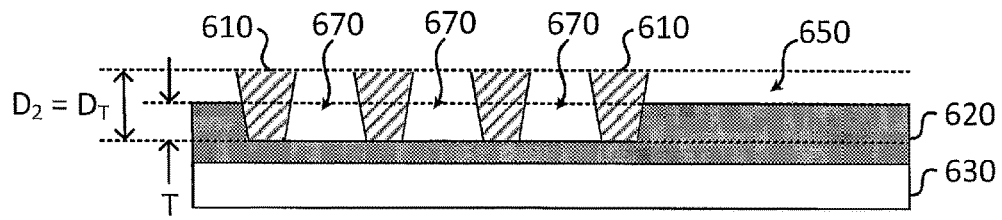

(d) Continue etching the first IMD layer until the recesses reach a target recess depth

*FIG. 6*

(e) Deposit a second IMD layer to form air gaps between the metal interconnects (f) Planarize the second IMD layer to provide a second planarized surface (g) Deposit an air gap liner on the second planarized surface (h) Repeat steps (a)-(f) to form air gaps between interconnects within a second metal layer (a) Copper Dual Damascene (DD) and CMP of first IMD layer (b) Form recesses within the first IMD layer using a combination of hard mask patterning, dry etch and wet etch processes (c) Deposit air gap liner and second IMD layer (d) Air Gap Formation in Second IMD layer

WET ETCH PROCESS AND METHODS TO FORM AIR GAPS BETWEEN METAL INTERCONNECTS

BACKGROUND

The present disclosure relates to integrated circuit (IC) processing. In particular, the present disclosure provides improved processes and methods to form air gaps between interconnects of an IC chip.

The continued scaling of integrated circuit (IC) chips has significantly increased the parasitic resistance and capacitance in multilevel interconnects. To reduce capacitance, enhance circuit performance and reduce power consumption, low-k dielectric materials are commonly used as inter-metal dielectrics (IMDs) and interlayer dielectrics (ILDs) between metal (e.g., copper or aluminum) interconnects. However, the use of low-k dielectric materials is challenging, due to their mechanical strength and process immunity properties, which typically degrade as the k-value decreases.

As an alternative to low-k dielectrics, a low k-value can also be achieved by removing all material from the IMD, thus, providing an air gap between the metal interconnects. Different air gap integration techniques have been utilized to fabricate multilevel metal interconnects. All air gap integration processes can be classified into the following categories: 1) partial or complete removal of the IMD material between the metal lines followed by nonconformal CVD deposition and chemical mechanical polishing (CMP) planarization, and 2) damascene integration of metal lines in sacrificial IMD layers, which are selectively removed through a permeable dielectric cap.

In the nonconformal CVD process, the air gap can be selectively formed between the metal interconnects, leaving dielectric materials in other places, which helps to retain mechanical strength of the air gap interconnects. When forming air gaps in multilayer interconnect structures using the sacrificial IMD approach, the permeable dielectric cap enables all sacrificial IMD layers at multiple metal levels to be removed after full completion of the stack. However, the sacrificial IMD layer can also be removed after completion of each metal layer. In the sacrificial IMD process, a protective cap is typically provided on the metal lines to protect the metal lines when removing the sacrificial IMD layer(s).

One of the biggest concerns with air gap integration in multilevel interconnects is the mechanical integrity of the entire IC stack. Due to the weaker mechanical properties of dielectric materials, subsequently performed packaging process steps (such as wire bonding and molding) may induce cracks inside the IC stack, which may create electrical failures in the short or longer term. An IC stack having good mechanical properties is, therefore, essential for chip survival during packaging. When air gaps are formed using the sacrificial IMD approach, the mechanical strength of the stack is based solely on the metal lines and other cap/barrier dielectrics. Exact placement of the air gaps in specific locations on each metal level is of great importance and will determine the mechanical Integrity of the air gap interconnects. However, mechanical integrity is less problematic in nonconformal CVD processes, since the CVD dielectric contributes to the mechanical strength of the stack in wider spaces.

FIG. 9 (PRIOR ART) illustrates a conventional air gap integration process 10 that is commonly used to form air gaps in multilayer interconnects. As shown in FIG. 9(a), the conventional gap integration process 10 may generally begin after a dual-damascene (DD) process has been used to form a plurality of copper interconnects 15 within a first intermetal dielectric (IMD) layer 20 formed on one or more underlying layers 25, and a chemical mechanical polishing (CMP) process has been performed to planarize the first IMD layer 20 and form a planarized surface 30.

In the conventional air gap integration process 10 shown in FIG. 9, a portion of the first IMD layer 20 sandwiched between two or more of the copper interconnects 15 is recessed using a combination of patterning, dry etch and wet etch processes. As shown in FIG. 9(b), for example, the first IMD layer 20 is recessed using a hard mask (HM) 40, which is patterned by an additional photomask (not shown) for the subsequently formed air gaps. Edges of the hard mask 40 sit on two of the copper interconnects 15, forming a HM open area overlying one or more spaces between two or more of the copper interconnects 15. In the recess step shown in FIG. 9(b), the portions of the first IMD layer 20 within the HM open area are etched away in a self-aligned manner to form recesses 35 between the interconnects.

The portions of the first IMD layer 20 within the HM open area are typically etched by exposing the substrate to a dry etch process or a combination of dry etch and wet etch processes. In one example process flow, a highly selective dry etch process may be initially used to minimize damage to the copper interconnects 15. However, because the dry etch process suffers from etch stoppage, it is difficult to recess deeply enough to achieve the target recess depth. Thus, in some process flows, a number of wet etch processes and/or thermal treatments may be performed after the initial dry etch process to compensate for the insufficient recess depth. In one example process flow, a first hydrofluoric acid (HF) strip may be performed after the dry etch to remove the high-density layer at the bottom of the dry etch recess. After the first HF strip, a partial pressure ammonia (pNH$_3$) and second HF strip may be performed to reach the target recess depth and form the recesses 35, as shown in FIG. 9(b).

Once the recesses 35 are formed to the target recess depth, an air gap liner 50 and second IMD layer 55 may be deposited using nonconformal CV deposition, as shown in FIG. 9(c). The air gap liner 50 covers the entirety of the first metal layer, including the recessed pattern, and the subsequent IMD deposition process closes the recesses 35 via pinch-off at the top of the IMD recess to form air gaps 45. After the second IMD layer 55 is deposited on the first metal layer, steps 9(a)-9(c) of the conventional air gap integration process 10 may be repeated to form air gaps 45 within the next metal layer, as shown in FIG. 9(d).

The conventional air gap integration process 10 shown in FIG. 9 utilizes multiple steps—hard mask patterning, dry etch and wet etch—after CMP to form the air gaps 45 between the copper interconnects 15. Although a highly selective dry etch process is used in recess step shown in FIG. 9(b), the dry etch process may still cause damage to the copper interconnects 15 (which results in resistance degradation) and the first IMD layer 20 (which causes capacitance degradation and defect generation). To avoid such damage, a need remains for improved processes and methods to form air gaps between interconnect structures.

SUMMARY

The present disclosure provides various embodiments of improved process flows and methods to form air gaps between metal interconnects. More specifically, the present disclosure provides improved process flows and methods that utilize a wet etch process to form recesses between metal interconnects formed on a patterned substrate. Unlike conventional air gap integration methods, the improved process flows and methods described herein utilize the critical dimension (CD) dependent etching provided by wet etch processes to etch an intermetal dielectric material formed between the metal interconnects at a faster rate than the intermetal dielectric material is etched in surrounding areas of the patterned substrate. This enables the improved process flows and methods described herein to form recesses (and subsequently form air gaps) between the metal interconnects without using a dry etch process.

According to one embodiment, a method is provided to form air gaps between metal interconnects. In general, the method may include providing a patterned substrate having a plurality of metal interconnects formed within a first dielectric material layer, wherein a critical dimension (CD) between the metal interconnects is small compared to surrounding areas of the patterned substrate, and exposing the patterned substrate to an etch solution to etch the first dielectric material layer and form recesses between the plurality of metal interconnects, wherein said etching removes portions of the first dielectric material layer arranged between the plurality of metal interconnects at a faster etch rate than the first dielectric material layer is removed in the surrounding areas of the patterned substrate. The method may continue etching the first dielectric material layer with the etch solution until the recesses formed between the plurality of metal interconnects reach a target recess depth. After the recesses are formed to the target recess depth, the method may include depositing a second dielectric material layer on the patterned substrate, wherein said depositing closes the recesses formed between the plurality of metal interconnects to form air gaps between the plurality of metal interconnects.

In some embodiments, the method described above may include one or more planarization steps. For example, prior to exposing the patterned substrate to the etch solution, the method may further include planarizing the patterned substrate to expose the plurality of metal interconnects and provide the first dielectric material layer with a first planarized surface. After the second dielectric material layer is deposited on the patterned substrate, the method may also further include planarizing the second dielectric material layer to provide a second planarized surface and depositing an air gap liner on the second planarized surface.

A wide variety of etch solutions may be used to etch the first dielectric layer in the method described herein. However, the particular etch solution used to etch the first dielectric layer may generally depend on a variety of factors including, but not limited to, the main reactive species used within the etch solution, the surface potential of a wall material adjacent to the first dielectric material layer being etched when the wall material is exposed to aqueous solutions of certain pH, and the availability to change the surface potential of the wall material by adjusting the pH of the etch solution and/or by adding surfactants.

In some embodiments, a wall material of the plurality of metal interconnects may exhibit a negative surface potential when exposed to aqueous solutions of certain pH. In such embodiments, exposing the patterned substrate to the etch solution may sometimes include exposing the patterned substrate to a non-aqueous organic-based etch solution that includes an organic solvent and an etchant chemical, which comprises anions as a main reactive species. When the patterned substrate is exposed to a non-aqueous organic-based etch solution containing anions as the main reactive species, the non-aqueous organic-based etch solution may increase an etch rate of the portions of the first dielectric material layer arranged between the plurality of metal interconnects compared to an etch rate of the first dielectric material layer in the surrounding areas of the patterned substrate.

In other embodiments, a wall material of the plurality of metal interconnects may exhibit a positive surface potential when exposed to aqueous solutions at certain pH. In such embodiments, exposing the patterned substrate to the etch solution may include exposing the patterned substrate to an aqueous-based etch solution that includes an etchant chemical and an aqueous solvent, or a non-aqueous organic-based etch solution that includes the etchant chemical and an organic solvent, depending on the main reactive species utilized within the etchant chemical. For example, exposing the patterned substrate to the etch solution may include: (a) exposing the patterned substrate to the aqueous-based etch solution or the non-aqueous organic-based etch solution when the etchant chemical comprises anions as a main reactive species, and (b) exposing the patterned substrate to the aqueous-based etch solution when the etchant chemical comprises cations as a main reactive species. When the patterned substrate is exposed to the aqueous-based etch solution or the non-aqueous organic-based etch solution, the aqueous-based etch solution or the non-aqueous organic-based etch solution may increase an etch rate of the portions of the first dielectric material layer arranged between the plurality of metal interconnects compared to an etch rate of the first dielectric material layer in the surrounding areas of the patterned substrate.

In one embodiment, the etchant chemical used within the non-aqueous organic-based etch solution may include one or more of: hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). The organic solvent used within the non-aqueous organic-based etch solution may include one or more of: methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

In other embodiments, exposing the patterned substrate to the etch solution may include exposing the patterned substrate to an aqueous-based etch solution that includes an aqueous solvent and an etchant chemical, which comprises cations as a main reactive species. When the patterned substrate is exposed to an aqueous-based etch solution containing cations as the main reactive species, the aqueous-based etch solution may increase an etch rate of the portions of the first dielectric material layer arranged between the plurality of metal interconnects compared to an etch rate of the first dielectric material layer in the surrounding areas of the patterned substrate.

According to another embodiment, another method is provided herein to form air gaps between metal interconnects. In general, the method may include providing a patterned substrate having a plurality of metal interconnects formed within a first dielectric material layer, wherein a critical dimension (CD) between the metal interconnects is small compared to surrounding areas of the patterned substrate, and exposing the patterned substrate to a non-aqueous organic-based etch solution to etch the first dielectric material layer and form recesses between the plurality of metal interconnects, wherein the non-aqueous organic-based etch solution etches portions of the first dielectric material layer arranged between the plurality of metal interconnects faster than the first dielectric material layer is etched in the surrounding areas of the patterned substrate. The method may continue etching the first dielectric material layer with the non-aqueous organic-based etch solution until the recesses formed between the plurality of metal interconnects reach a target recess depth. After the recesses are formed to the target recess depth, the method may include depositing a second dielectric material layer on the patterned substrate, wherein said depositing closes the recesses formed between the plurality of metal interconnects to form air gaps between the plurality of metal interconnects.

In some embodiments, the non-aqueous organic-based etch solution used to etch the first dielectric material layer may include an etchant chemical and an organic solvent. The etchant chemical may include one or more of: hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH). The organic solvent may include one or more of: methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

As noted above, the etch solution used to etch the first dielectric layer may depend, at least in part, on the main reactive species used within the etch solution and the surface potential of the wall material adjacent to the first dielectric material layer being etched. In some embodiments, the wall material of the plurality of metal interconnects may exhibit a negative surface potential when exposed to aqueous solutions of certain pH. When the wall material exhibits a negative surface potential and the etchant chemical utilized within the non-aqueous organic-based etch solution comprises anions as a main reactive species, exposing the patterned substrate to the non-aqueous organic-based etch solution may increase an etch rate of the portions of the first dielectric material layer arranged between the plurality of metal interconnects compared to an etch rate of the first dielectric material layer in the surrounding areas of the patterned substrate.

The methods described herein may provide a variety of advantages over conventional methods used to form air gaps between metal interconnects. Unlike conventional methods, the methods described herein use a wet etch process to form the recesses between the metal interconnects. In the methods described herein, the recesses formed between the plurality of metal interconnects reach the target recess depth without using a dry etch process. This reduces the number of processing steps needed to form the recesses to the target recess depth and avoids damaging the metal interconnects and the dielectric material surrounding the recesses. In addition, the methods described continue etching the first dielectric material layer with the etch solution to completely remove the portions of the first dielectric material layer arranged between the plurality of metal interconnects, while retaining a thickness of the first dielectric material layer in the surrounding areas of the patterned substrate. This enables the methods described herein to maintain mechanical integrity of the subsequently formed air-gap interconnects.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1A:
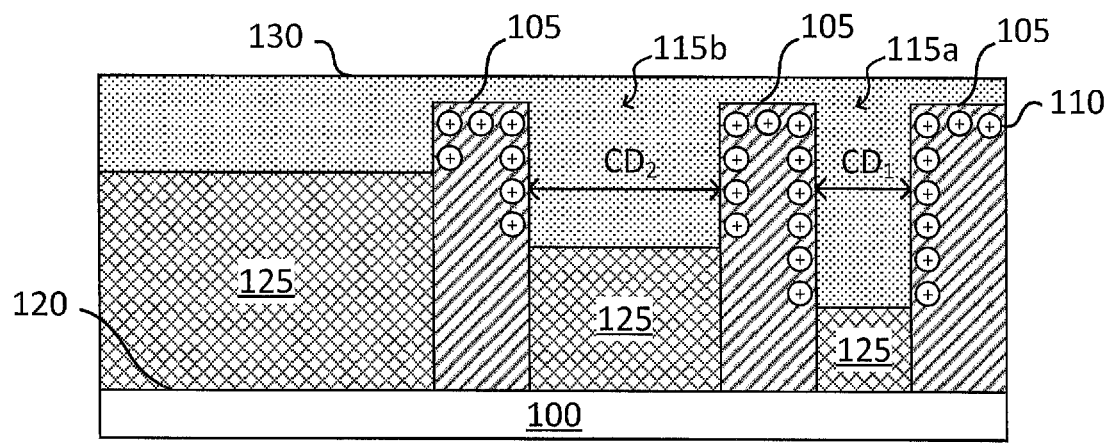
FIG. 1A is a cross-sectional view through a substrate having features of different critical dimension (CD) illustrating CD-dependent etching of material within the features when the substrate is exposed to a non-aqueous organic-based etch solution.

The present disclosure provides various embodiments of improved process flows and methods to form air gaps between metal interconnects. More specifically, the present disclosure provides improved process flows and methods that utilize a wet etch process to form recesses between metal interconnects formed on a patterned substrate. Unlike conventional air gap integration methods, the improved process flows and methods described herein utilize the critical dimension (CD) dependent etching provided by wet etch processes to etch an intermetal dielectric material formed between the metal interconnects at a faster rate than the intermetal dielectric material is etched in surrounding areas of the patterned substrate. This enables the improved process flows and methods described herein to form recesses (and subsequently form air gaps) between the metal interconnects without using a dry etch process.

In the embodiments disclosed herein, a patterned substrate is provided having a plurality of metal interconnects formed within a first dielectric material layer, where the critical dimension (CD) between the metal interconnects is small compared to other areas of the patterned substrate surrounding the metal interconnects. A wet etch process is then used to form recesses within the first dielectric material layer between the plurality of metal interconnects. During the wet etch process, the patterned substrate is exposed to an etch solution, which reacts with the first dielectric material layer and promotes dissolution of reaction products to etch the first dielectric material layer and form recesses between the metal interconnects.

When etching the first dielectric material layer, the rate at which material is removed from the patterned substrate (i.e., the etch rate) may differ depending on a variety of factors, such as the CD of the recesses formed between the metal interconnects compared to the surrounding areas of the patterned substrate, the etchant chemical(s) used within the etch solution, the solvent used within the etch solution, the ratio of etchant chemical(s) to solvent used within the etch solution, the pH of the etch solution and the wall material adjacent to the material being etched. The difference in etch rate is known in the art as CD-dependent etching.

Because the CD between the metal interconnects is small compared to the surrounding areas of the patterned substrate, the wet etch process described herein removes portions of the first dielectric material layer arranged between the metal interconnects at a faster etch rate than the first dielectric material layer is removed in the surrounding areas of the patterned substrate. The difference in etch rate enables the wet etch process described herein to completely remove the portions of the first dielectric material layer arranged between the metal interconnects, and thus, form recesses that reach a target recess depth, while retaining at least a portion of the first dielectric material layer in the surrounding areas of the patterned substrate. After the recesses formed between the metal interconnects reach the target recess depth, a second dielectric material layer may be deposited on the patterned substrate to close (or "pinch off") the recesses and form air gaps between the metal interconnects.

By utilizing CD-dependent wet etching, and continuing the wet etch process until the recesses formed between the metal interconnects reach a target recess depth, the improved process flows and methods described herein form recesses (and subsequently form air gaps) between the metal interconnects without using a dry etch process. In this manner, the improved process flows and methods described herein reduce the number of processing steps required to form recesses between the metal interconnects (by eliminating the hard mask patterning and dry etch process steps used in conventional air gap integration methods) and avoid damage to the metal interconnects and the dielectric material, while maintaining mechanical integrity of the air-gap interconnects.

The wet etch process described herein may utilize a wide variety of etch solutions. For example, a non-aqueous organic-based etch solution or an aqueous-based etch solution may be used to etch the first dielectric material layer and form the recesses between the metal interconnects. The etch solution used to etch the first dielectric layer may depend on a variety of factors including, but are not limited to, the main reactive species used within the etch solution, the surface potential of a wall material adjacent to the first dielectric material layer being etched when the wall material is exposed to aqueous solutions, and the availability to change the surface potential of the wall material by adjusting the pH of the etch solution or adding surfactants. In some embodiments, the wall material adjacent to the first dielectric material layer being etched may exhibit a negative surface potential when exposed to aqueous solutions. In such embodiments, the wet etch process disclosed herein may etch the first dielectric material layer faster within the recesses and slower within the surrounding areas of the substrate by using: (a) a non-aqueous organic-based etch solution containing an organic solvent and an etchant chemical, which includes anions as the main reactive species, or (b) an aqueous-based etch solution containing an aqueous solvent and an etchant chemical, which includes cations as the main reactive species.

Figure 1B:
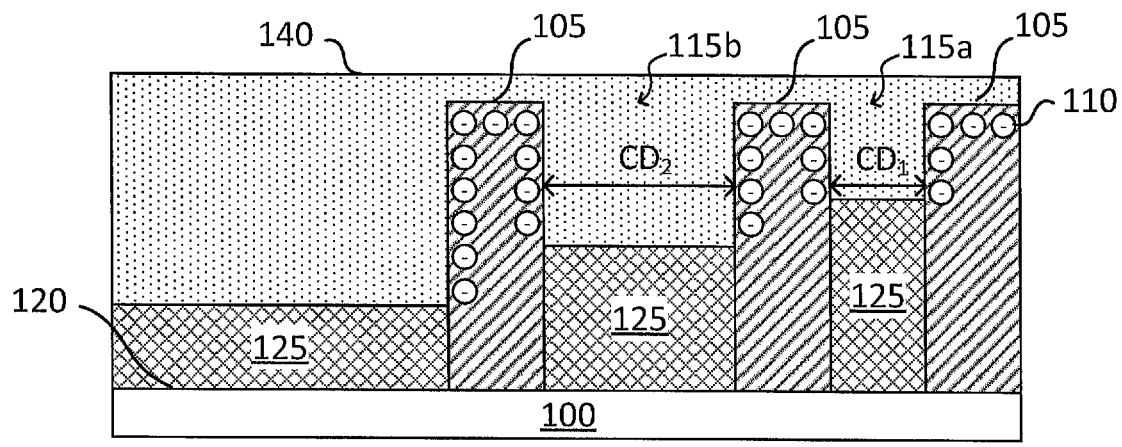
FIG. 1B is a cross-sectional view through a substrate having features of different critical dimension (CD) illustrating CD-dependent etching of material within the features when the substrate is exposed to an aqueous-based etch solution.
Figure 2:
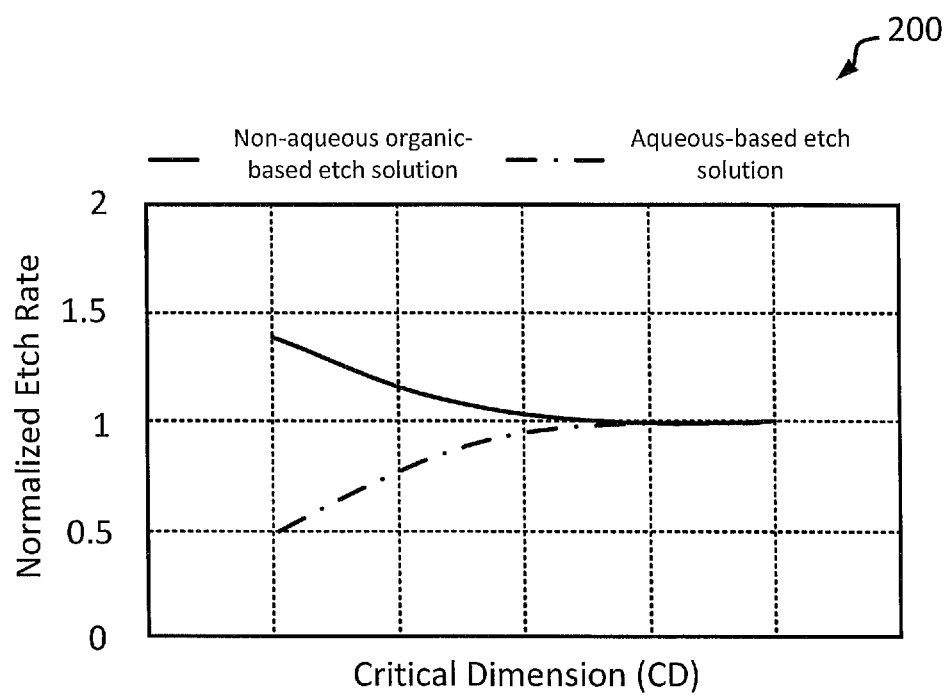
FIG. 2 is a graph illustrating normalized etch rate vs. feature CD when the substrate is exposed to a non-aqueous organic-based etch solution and an aqueous-based etch solution.

FIGS. 1A-1B and 2 illustrate CD-dependent etching of material deposited within features having different CD, and across more planar areas of a substrate, when the substrate is exposed to a non-aqueous organic-based etch solution 130 (FIGS. 1A and 2) and an aqueous-based solution 140 (FIGS. 1B and 2). As used herein, an aqueous-based etch solution 140 is a solution that includes one or more etchant chemicals mixed with an aqueous solvent (e.g., water ($H_2O$) or deionized water). A non-aqueous organic-based etch solution 130, on the other hand, is a solution that includes one or more etchant chemicals mixed with an organic solvent. In some embodiments, the non-aqueous organic-based etch solution 130 may include an etchant chemical that contains water (e.g., hydrofluoric acid (HF) containing for example 49% HF and 51% water, or ammonium hydroxide ($NH_4OH$) containing for example 29% $NH_4OH$ and 71% water, in terms of weight %) and thus, may include a minimal amount of water.

The substrate 100 shown in FIGS. 1A-1B is provided with a plurality of structures 105 (e.g., metal lines, fins, etc.) that extend above a surface of the substrate. Each of the plurality of structures 105 is separated by a feature 115 (such as, e.g., a gap, trench, hole, etc.). A critical dimension (CD) of the features 115 may be the same, or may be different, as shown in FIGS. 1A-1B. In the example embodiments shown in FIGS. 1A-1B, the substrate 100 is depicted as having a first feature 115a having a smaller CD ($CD_1$) and a second feature 115b having a larger CD ($CD_2$). The CD of the plurality of features 115 is relatively small (e.g., less than 100 nm) compared to the more planar areas 120 of the substrate 100 surrounding the plurality of structures 105.

A material 125 to be etched is deposited onto a surface of the substrate 100, the plurality of structures 105 and within the features 115 formed between the plurality of structures 105. The material 125 may include a wide variety of semiconductor materials. For example, the material 125 may be an oxide, a dielectric material, a silicon or a metal. In one example, the material 125 may be a silicon oxide (such as, e.g., silicon dioxide, $SiO_2$). Other oxide and dielectric materials, including low-k dielectric materials, may also be formed within the plurality of features 105 and etched.

In the embodiment shown in FIG. 1A, the substrate 100 is exposed to a non-aqueous organic-based etch solution 130 that includes one or more etchant chemicals and an organic solvent. Examples of etchant chemicals that may be included within non-aqueous organic-based etch solution 130 include, but are not limited to, hydrofluoric acid (HF), ammonium hydroxide (NH$_4$OH), hydrochloric acid (HCl), hydrogen peroxide (H$_2$O$_2$), nitric acid (HNO$_3$), phosphoric acid (H$_3$PO$_4$), potassium hydroxide (KOH), Tetramethylammonium hydroxide (TMAH) and other etchant chemicals containing an anion (negatively charged ion) as the main reactive species.

A wide variety of organic solvents may be used within the non-aqueous organic-based etch solution 130 described herein. Examples of organic solvents that may be included within the non-aqueous organic-based etch solution 130 include, but are not limited to, various alcohols (e.g., methanol (CH$_4$O), ethanol (C$_2$H$_6$O), isopropyl alcohol (C$_3$H$_8$O), benzyl alcohol (C$_7$H$_8$O), etc.), polyhydric alcohols (e.g., ethylene glycol (C$_2$H$_6$O$_2$) etc.), acetic acid (CH$_3$COOH), ketones (e.g., acetone (C$_3$H$_6$O), propylene carbonate (C$_4$H$_6$O$_3$), etc.), alkanes (e.g., n-hexane (C$_6$H$_{14}$), cyclohexane (C$_6$H$_{12}$), etc.), ethers (e.g., diethyl ether (C$_4$H$_{10}$O), tetrahydrofuran (C$_4$H$_8$O), etc.), aromatic hydrocarbons (e.g., benzene (C$_6$H$_6$), toluene (C$_7$H$_8$), etc.), halogen compounds (e.g., dichloromethane (CH$_2$Cl$_2$), trichloroethylene (C$_2$HCl$_3$), 1,1,1-trichloroethane (C$_2$H$_3$Cl$_3$), 1,2-dichloroethane (C$_2$H$_4$Cl$_2$), etc.), nitrogen compounds (e.g., N-methyl-2-pyrrolidone (C$_5$H$_9$NO), etc.), sulfuric compounds (e.g., dimethyl sulfoxide (C$_2$H$_6$OS), etc.), and other volatile, carbon-based solvents such as ethyl lactate (C$_5$H$_{10}$O$_3$), ethanolamine (C$_2$H$_7$NO) and propylene glycol methyl ether acetate (C$_6$H$_{12}$O$_3$).

In some embodiments, the non-aqueous organic-based etch solution 130 may include an etchant chemical containing an anion as the main reactive species (e.g., hydrofluoric acid, ammonium hydroxide or hydrochloric acid) mixed with an alcohol (e.g., isopropyl alcohol, IPA), a polyhydric alcohol (e.g., ethylene glycol, EG), acetic acid, AA, or a ketone (e.g., propylene carbonate, PC). In at least one preferred embodiment, the non-aqueous organic-based etch solution 130 may include hydrofluoric acid mixed with IPA, AA, EG or PC. Other organic solvents described herein may also be mixed with hydrofluoric acid or other etchant chemicals (such as NH$_4$OH or HCl) containing an anion as the main reactive species. Although the etchant chemicals described herein can be mixed with many different organic solvents, the compatibility and solubility of the etchant chemical(s) and organic solvent must be carefully considered.

When the substrate 100 is exposed to a non-aqueous organic-based etch solution 130 containing anions as the main reactive species, portions of the features 115 exposed to the non-aqueous organic-based etch solution 130 may exhibit a positive surface potential, as shown in FIG. 1A, depending on the pH of the etch solution and the wall material 110 used to form the features 115. For example, exposed portions of the features 115 may exhibit a positive surface potential (as shown in FIG. 1A) when the substrate 100 is exposed to a non-aqueous organic-based etch solution 130 containing hydrofluoric acid mixed with an organic solvent (e.g., IPA, AA, EG or PC) and the wall material 110 includes a silicon-containing material, such as amorphous silicon (a-Si), polysilicon (poly-Si), silicon nitride (SiN), silicon carbon nitride (SiCN) or silicon oxynitride (SiON). In some cases, the exposed portions of the features 115 may also exhibit a positive surface potential when conductive wall materials 110, such as copper (Cu), aluminum (Al), etc., are exposed to a non-aqueous organic-based etch solution 130.

When the substrate 100 is exposed to a non-aqueous organic-based etch solution 130, as shown in FIG. 1A and described above, the anions within the etchant chemical are attracted to the positively charged surface. This increases the local concentration of anions within the features 115, which increases the etch rate of the material 125 deposited within the features 115 compared to the more planar areas 120 of the substrate 100. Thus, the material 125 is etched faster within the plurality of features 115 and slower within the more planar areas 120 of the substrate 100 surrounding the plurality of structures 105. This is shown schematically in FIG. 1A and in the graph 200 shown in FIG. 2. When features 115 of different CD are formed within the plurality of structures 105, as shown in FIG. 1A, the increase in etch rate is more pronounced within features having smaller CD (such as feature 115a) and less pronounced within features having larger CD (such as feature 115b). However, the etch rate within the features 115 is significantly faster than the etch rate achieved across the more planar areas 120 of the substrate 100.

In the embodiment shown in FIG. 1B, the substrate 100 is exposed to an aqueous-based etch solution 140 that includes one or more etchant chemicals and an aqueous solvent. As noted above, an aqueous-based etch solution 140 is a solution that includes an etchant chemical mixed with an aqueous solvent (e.g., water (H$_2$O) or deionized water). Examples of etchant chemicals that may be included within aqueous-based etch solution 140 include, but are not limited to, hydrofluoric acid (HF), ammonium hydroxide (NH$_4$OH), hydrochloric acid (HCl), hydrogen peroxide (H$_2$O$_2$), nitric acid (HNO$_3$), phosphoric acid (H$_3$PO$_4$), potassium hydroxide (KOH), Tetramethylammonium hydroxide (TMAH) and other etchant chemicals containing an anion (negatively charged ion) as the main reactive species.

Figure 5:
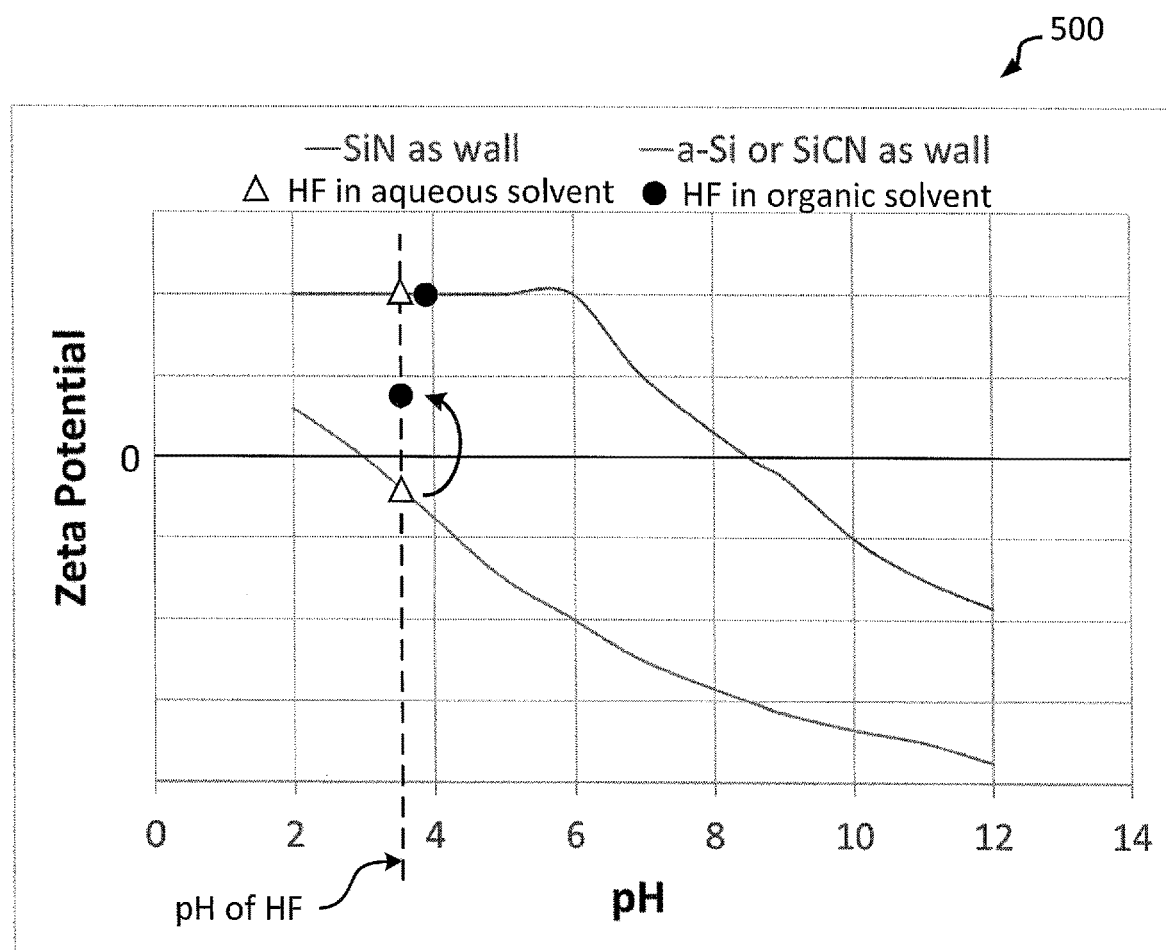
FIG. 5 is a graph illustrating Zeta potential vs pH for various etch solutions and wall materials.

When the substrate 100 is exposed to an aqueous-based etch solution 140 containing anions as the main reactive species, portions of the features 115 exposed to the aqueous-based etch solution 140 may exhibit a negative surface potential, as shown in FIG. 1B, depending on the pH of the etch solution and the wall material 110 used to form the features 115. For example, exposed portions of the features 115 may exhibit a negative surface potential (as shown in FIG. 1B) when the substrate 100 is exposed to an aqueous-based etch solution 140 containing hydrofluoric acid mixed with water and the wall material 110 includes a silicon-containing material (such as a-Si, poly-Si, SiCN or SiON) or a conductive material (such as Cu or Al). However, other silicon-containing materials, such as silicon nitride (SiN), may exhibit a positive surface potential (not shown in FIG. 1B) when the substrate 100 is exposed to an aqueous-based etch solution 140 containing hydrofluoric acid mixed with water. This is shown in FIG. 5 and described in more detail below.

When the substrate 100 is exposed to an aqueous-based etch solution 140, as shown in FIG. 1B and described above, the negative surface potential of the wall material 110 repels the anions within the etchant chemical to decrease its local concentration in the features 115, and thus, decrease the etch rate of the material 125 deposited within the features 115. When features 115 of different CD are formed within the plurality of structures 105, as shown in FIG. 1B, the decrease in etch rate is more pronounced in features having smaller CD (such as feature 115a) and less pronounced in features having larger CD (such as feature 115b). As a result, the material 125 is etched slower in features having smaller CD (such as feature 105a) and faster in features having larger CD (such as feature 105b). As shown in FIG. 1B, the etch rate across the more planar areas 120 of the substrate is significantly faster than the etch rate within the features 115.

When etching the material 125 formed within the plurality of features 115, the etch rate of the material 125 may depend on a variety of factors, including the critical dimension (CD) of the features 115, the particular etchant chemical(s) and/or reactive species used within the etch solution, the particular solvent used within the etch solution, the ratio of etchant chemical(s) to solvent used within the etch solution and/or the pH of the etch solution. In addition to these factors, the electric potential of the wall material 110 adjacent to the material 125 being etched may also affect the etch rate of the material 125, depending on the etch solution used.

As shown in FIGS. 1A-1B and 2, non-aqueous organic-based etch solutions 130 and aqueous-based etch solutions 140 may sometimes have the opposite effect on etch rate. When a non-aqueous organic-based etch solution 130 is used to etch the material 125, the etch rate is increased within features of smaller CD (such as feature 115a) and decreased within features of larger CD (such as feature 115b). However, the opposite is true when an aqueous-based etch solution 140 is used to etch the material 125. This may be due, at least in part, to the Zeta potential and the electric double layer (EDL) that exists between the wall material 110 and the etch solution.

Figure 3:
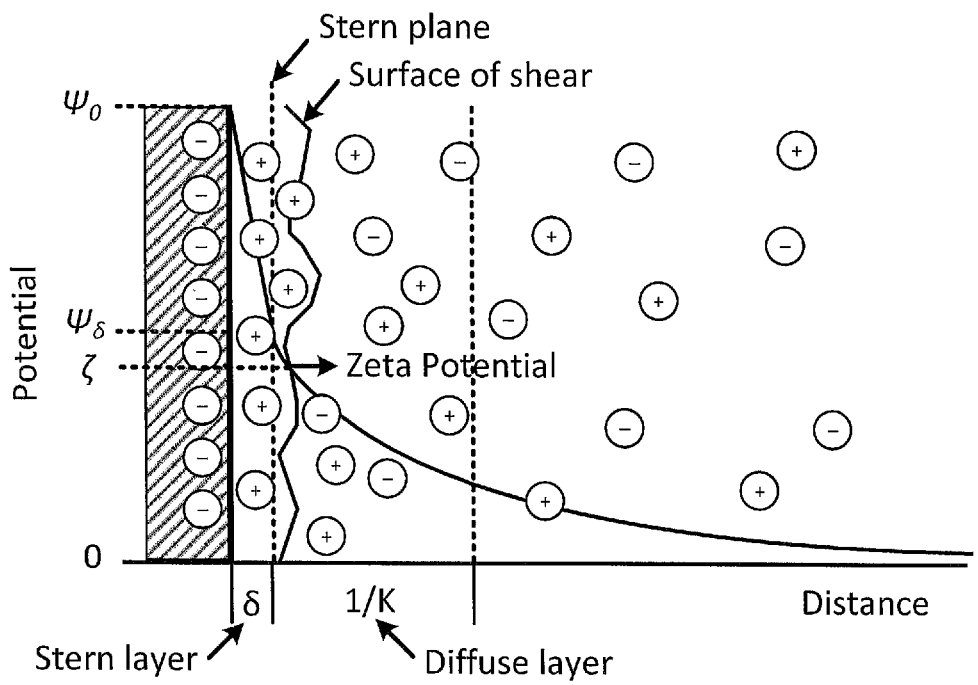
FIG. 3 is a schematic diagram illustrating the Zeta potential and the electric double layer (EDL) that exists between a charged wall surface and the etch solution.

FIG. 3 is a schematic diagram illustrating Zeta potential and the electric double layer that exists between the wall material and the etch solution. The etch solution includes cations (positively charged ions) and anions (negatively charged ions). When the etch solution comes in contact with a wall material having negative surface potential, as shown in FIG. 3, cations within the etch solution are attracted to and adsorbed onto the wall material by electrostatic and/or van der Walls forces. The opposite is true when the etch solution comes in contact with a wall material having positive surface potential (i.e., anions within the etch solution are attracted to and adsorbed onto the wall material). This attraction produces an electric double layer (i.e., a layer that does not satisfy electroneutrality) between the wall material and the etch solution.

According to the Stern model, the electric double layer (EDL) is divided into two parts separated by a plane, referred to as the Stern plane. The centers of adsorbed ions are located in the Stern layer between the wall surface and the Stern plane. Ions with centers located beyond the Stern plane form the Diffuse layer of the EDL. As shown in FIG. 3, the electric potential ($\Psi$) near the wall surface changes linearly between $\Psi_0$ and $\Psi_\delta$ (the potential at the Stern plane) and decays exponentially with distance from $\Psi_\delta$ to zero in the Diffuse layer and beyond. The Zeta potential ($\zeta$) is the electric potential that exists at the Surface of Shear between the charged wall surface and the etch solution. The Zeta potential ($\zeta$) may be positive, zero or negative, depending on the wall material and the pH of the etch solution.

Figure 4:
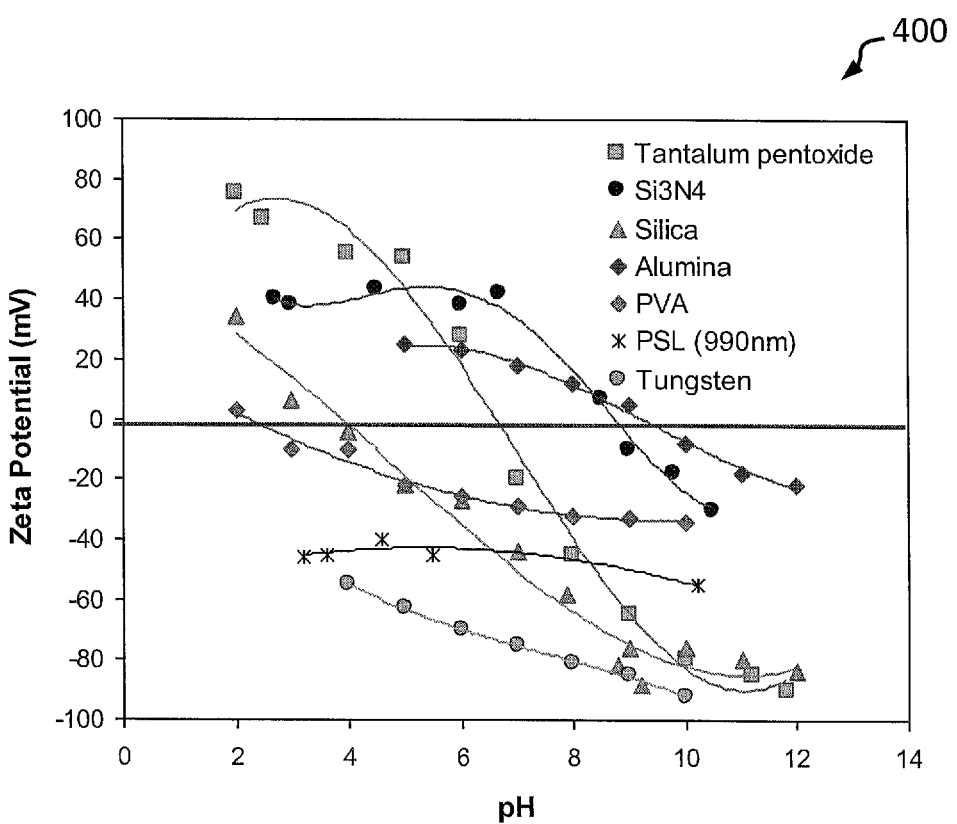
FIG. 4 is a graph illustrating Zeta potential vs pH for various wall materials.

FIG. 4 depicts a graph 400 illustrating Zeta potential (expressed in mV) vs pH for various wall materials. As shown in FIG. 4, the Zeta potential generally increases with decreasing pH and decreases with increasing pH. In some embodiments, the Zeta potential between the charged wall surface and the etch solution can be changed by changing the pH of the etch solution (e.g., by changing the etchant chemical(s) used within the etch solution, or by adding an acid or base to the etch solution), as shown in FIG. 4. In other embodiments, the Zeta potential between the charged wall surface and the etch solution can be changed by adding a surfactant to the etch solution. In yet other embodiments, the Zeta potential between the charged wall surface and the etch solution can be changed by utilizing an organic solvent, instead of an aqueous solvent, within the etch solution (depending on the pH of the etch solution). This is illustrated in the graph 500 shown in FIG. 5.

The graph 500 shown in FIG. 5 illustrates the Zeta potential vs pH for various etch solutions and wall materials (e.g., SiN, a-Si and SiCN). When hydrofluoric acid (HF) is mixed with an aqueous solvent and used as an etch solution, the Zeta potential (denoted with a $\Delta$) between the etch solution and the wall material is: (a) negative for a-Si and SiCN (resulting in a negatively charged wall surface), and (b) positive for SiN (resulting in a positively charged wall surface). When hydrofluoric acid is mixed with organic solvent, instead of an aqueous solvent, the Zeta potential (denoted with a •) is positive for a-Si, SiCN and SiN (resulting in positively charged wall surfaces). The graph 500 shown in FIG. 5 shows that, while organic solvents have little to no effect on the Zeta potential between an etch solution and an already positively charged wall surface, the Zeta potential between the etch solution and a negatively charged wall surface can (sometimes) be changed to a positive surface potential by using an organic solvent, instead of an aqueous solvent, within the etch solution. This difference in Zeta potential may explain, at least in part, the opposing effects that aqueous-based etch solutions and non-aqueous organic-based solutions have on etch rate when etching features having different CD.

In the graph 500 shown in FIG. 5, an organic solvent is utilized within an HF etch solution to change the Zeta potential of a negatively charged a-Si or SiCN wall surface to a positive surface potential. However, the use of an organic solvent may not be enough to shift the Zeta potential from a negative surface potential to a positive surface potential for all wall surfaces. In some cases, the pH of an organic-based etch solution can be adjusted (e.g., by changing the etchant chemical(s) used within the etch solution, or by adding an acid or base to the etch solution) to further adjust the Zeta potential, thus achieving a positive surface potential and the desired CD-dependent etch results. If the pH cannot be changed (e.g., due to compatibility concerns), a surfactant can be added to the organic-based etch solution to adjust the Zeta potential and achieve the desired CD-dependent etch results. In some cases, all three methods (organic solvent, pH tuning and surfactant addition) can be used to provide or enhance the CD-dependent trend.

In the description provided above, organic-based etch solutions are used (with or without pH tuning and surfactant addition) to increase the etch rate of material formed within features having smaller CD when: (a) the organic-based etch solution contains anions as the main reactive species, and (b) the material being etched is adjacent to a wall material that exhibits a negative surface potential in aqueous solutions. However, organic-based etch solutions may not provide the desired CD-dependent etch results in all embodiments. In some embodiments, an aqueous-based etch solution may be used to increase the etch rate of material formed within features having smaller CD when cations are used as the main reactive species. In some embodiments, the pH may be adjusted and/or a surfactant may be added to an aqueous-based etch solution containing cations as the main reactive species to provide the desired CD-dependent etch results.

As described herein, one mechanism that may cause the variation in etch rates when using the various etch solutions, various wall materials, and various CDs is a mechanism related to surface potentials. However, the techniques described herein are not strictly limited to such techniques. Thus, the CD-dependent etch rates described herein may be accomplished through other mechanisms and the etch rate advantages described and obtained with the techniques provided herein are not limited to the particular surface potential mechanisms. Rather, the advantages may be obtained utilizing other mechanisms also.

The present disclosure takes advantage of the difference in etch rate that occurs when wet etch processes are used to etch a material formed within features (e.g., recesses, trenches, holes, slits, etc.) having a relatively small CD compared to surrounding areas of the substrate. In the present disclosure, a wet etch process is used to form recesses between a plurality of metal interconnects formed within a first dielectric material layer (e.g., a first IMD layer) of a patterned substrate. During the wet etch process, the patterned substrate is exposed to an etch solution, which removes portions of the first dielectric material layer arranged between the plurality of metal interconnects at a faster etch rate than the first dielectric material layer is removed in surrounding areas of the patterned substrate. The wet etch process disclosed herein continues etching the first dielectric material layer with the etch solution until the recesses formed between the metal interconnects reach a target recess depth. Once the recesses are formed to the target recess depth, a second dielectric material layer is deposited on the patterned substrate to close (or "pinch off") the recesses formed between the metal interconnects to form air gaps between the metal interconnects.

Unlike conventional air gap integration methods, which utilize a combination of hard mask patterning, dry etch and wet etch processes to form recesses between metal interconnects, the present disclosure provides an all-in-one wet etch process, which completely removes the dielectric material formed between the metal interconnects, while retaining at least a portion of the dielectric material in surrounding areas of the patterned substrate. This reduces the number of processing steps needed to form the recesses to the target recess depth and avoids damaging the metal interconnects and the dielectric material surrounding the recesses, while maintaining mechanical integrity of the subsequently formed air-gap interconnects.

Figure 6:
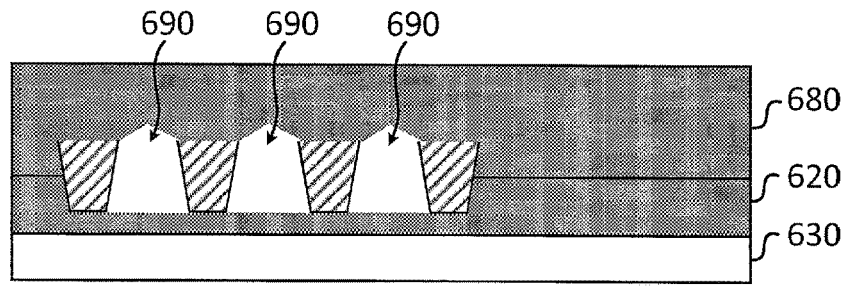
FIG. 6 is a cross-sectional view through a patterned substrate having a plurality of metal interconnects formed within a dielectric material layer, illustrating one embodiment of an improved process that utilizes the techniques described herein to form air gaps between the metal interconnects.
Figure 6:
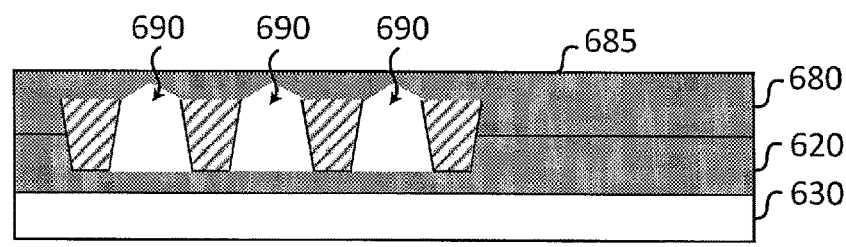
Figure 6:
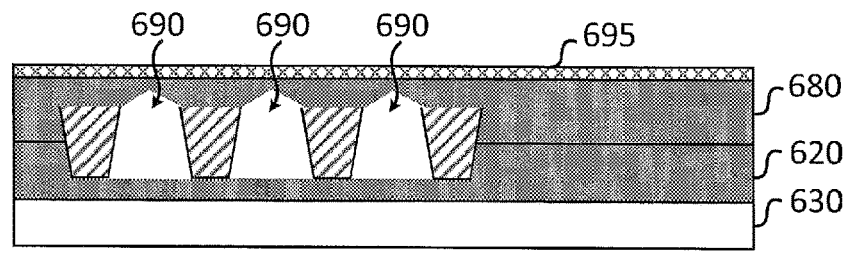
Figure 6:
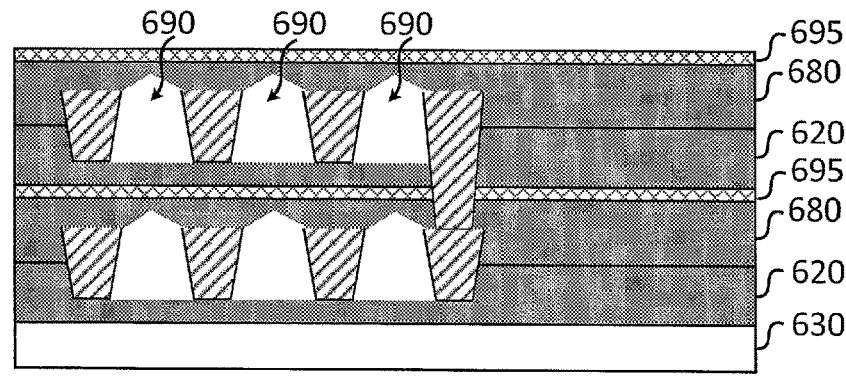
Figure 7:
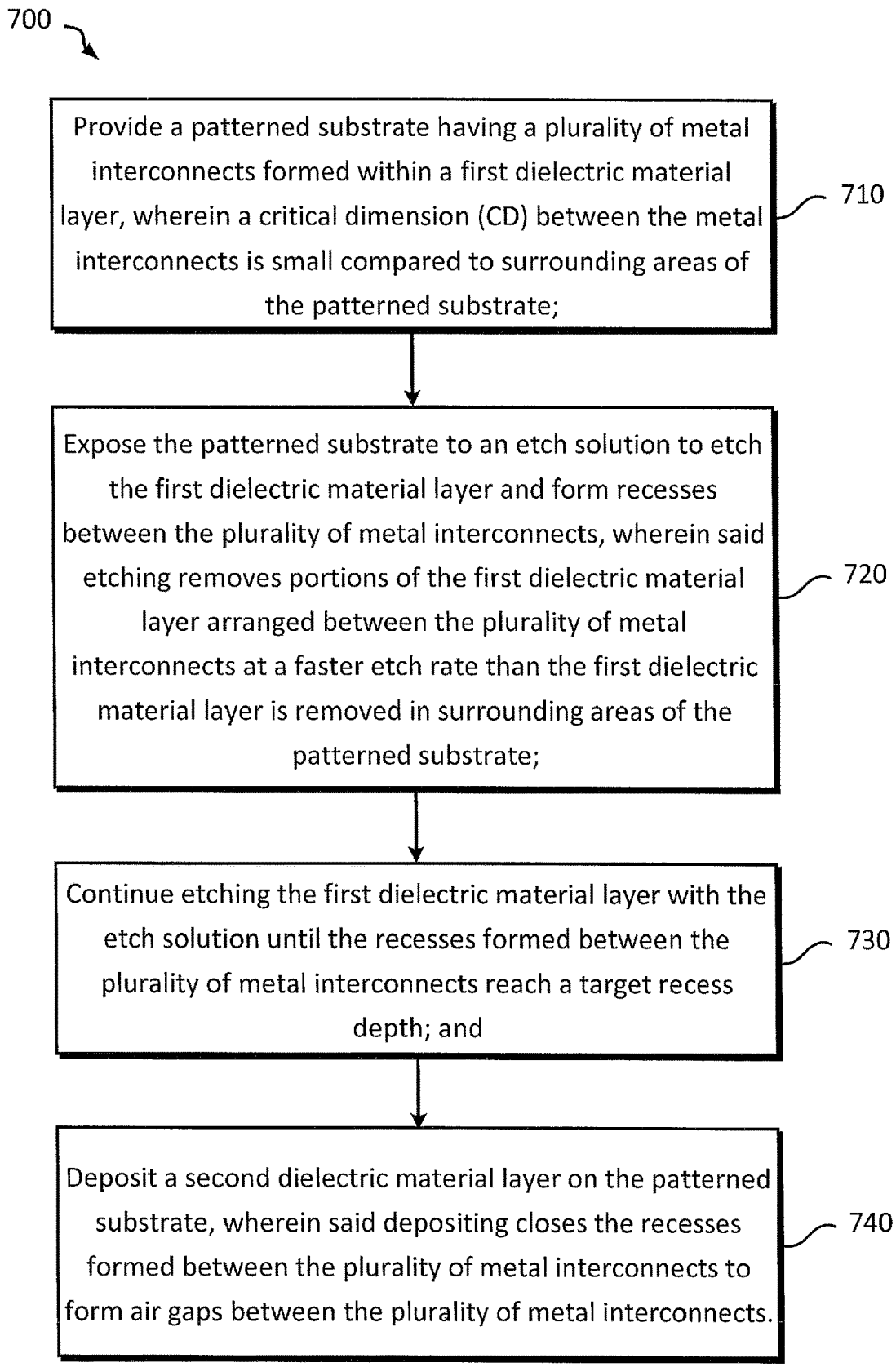
FIG. 7 is a flowchart diagram illustrating one embodiment of a method that utilizes the techniques described herein to form air gaps between metal interconnects.
Figure 8:
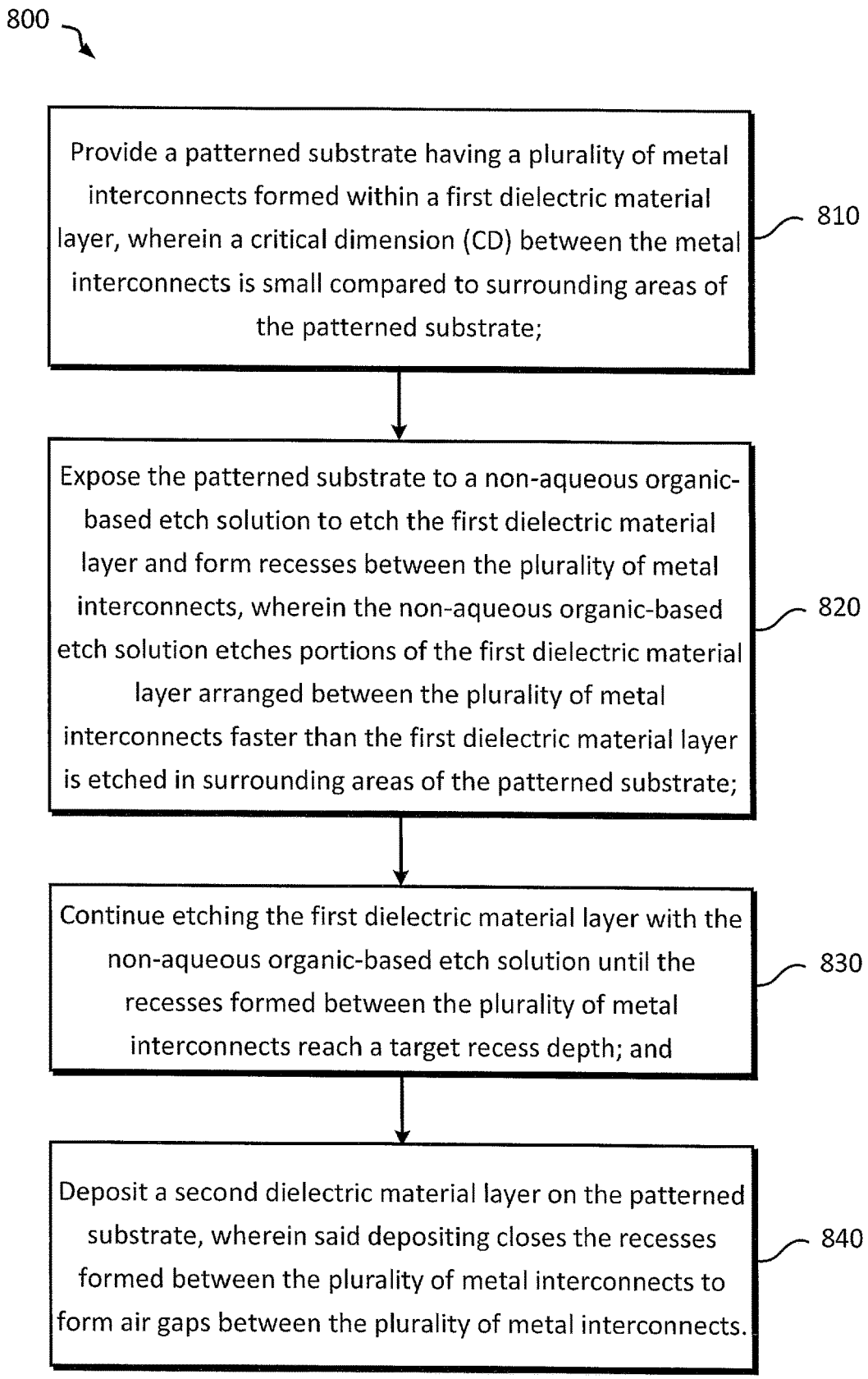
FIG. 8 is a flowchart diagram illustrating another embodiment of a method that utilizes the techniques described herein to form air gaps between metal interconnects.
Figure 9:
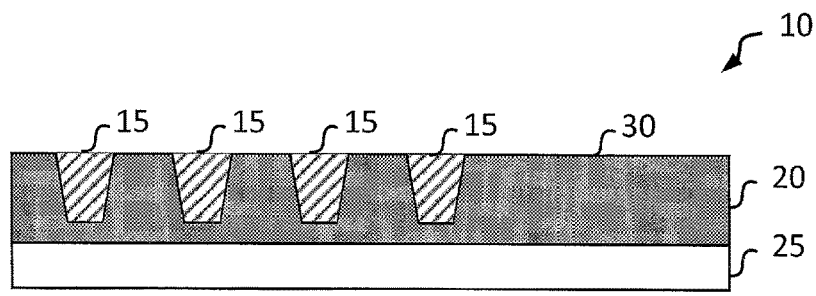
FIG. 9 (PRIOR ART) illustrates a conventional nonconformal CVD process commonly used to form air gaps in multilayer interconnects.
Figure 9:
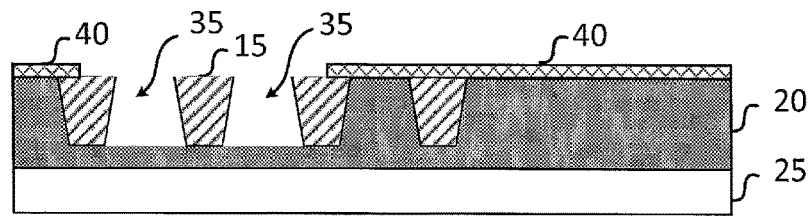
Figure 9:
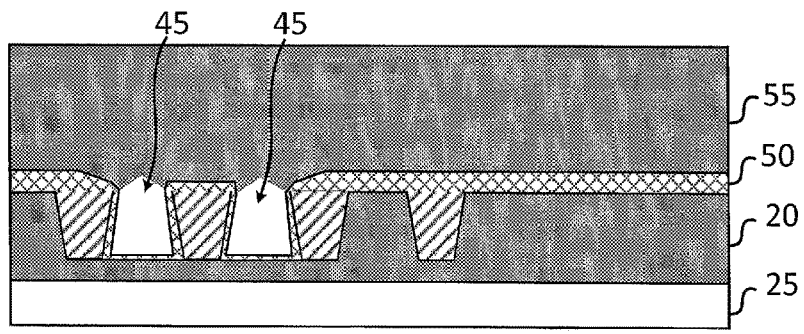
Figure 9:
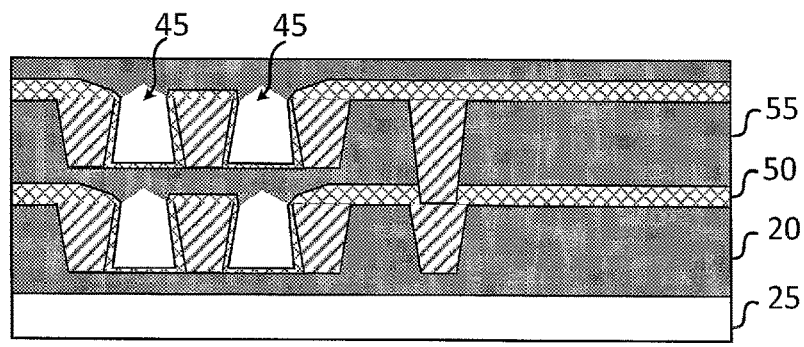

FIGS. 6-8 illustrate various embodiments of an improved process 600 and methods 700 and 800 that utilize the techniques described herein to form air gaps between metal interconnects. It will be recognized that the embodiments shown in FIGS. 6-8 are merely exemplary and additional processes and methods may utilize the techniques described herein. Further, additional processing steps may be added to the embodiments shown in FIGS. 6-8, as the steps shown in the figures are not intended to be exclusive. Moreover, the order of the steps is not limited to the order shown in the figures, as different orders may occur and/or various steps may be performed in combination or at the same time.

As shown in FIGS. 6, 7 and 8, the improved process 600 and methods 700, 800 may generally begin (in FIG. 6(a), step 710 of FIG. 7 and step 810 of FIG. 8) by providing a patterned substrate having a plurality of metal interconnects 610 formed within a first dielectric material layer 620 (e.g., a first IMD layer). As shown in FIG. 6(a), a critical dimension ($CD_1$) between the metal interconnects 610 may be small compared to surrounding areas 650 of the patterned substrate ($CD_2$).

The metal interconnects 610 shown in FIG. 6(a) may be formed from a wide variety of conductive materials, such as aluminum (Al), copper (Cu), etc., which are commonly used to form metal interconnects in integrated circuits. The metal interconnects 610 may generally include a conductive metal core (e.g., a Cu core), which may be surrounded by one or more layers, such as a barrier layer (which prevents metal diffusion into the dielectric layer) and a liner layer (which improves barrier adherence to the metal core). In one embodiment, copper interconnects may be formed within the patterned substrate by forming a tantalum nitride barrier, a tantalum liner, a copper seed layer (which initiates the metal fill/plating), and finally, the bulk (core conducting) copper metal.

The first dielectric material layer 620 shown in FIG. 6(a) may also include a wide variety of dielectric materials. For example, the first dielectric material layer 620 may include an oxide (such as, e.g., silicon dioxide, $SiO_2$) or a low-k dielectric material having a dielectric constant (k) less than that of silicon dioxide (k=3.9). The first dielectric material layer 620 may be formed above one or more underlying layers 630, as is known in the art. As shown in FIG. 6(a), the first dielectric material layer 620 may be planarized to expose the plurality of metal interconnects 610 and provide the first dielectric material layer 620 with a planarized surface 640. In some embodiments, a chemical mechanical polishing (CMP) process may be used to planarize the surface.

Once the patterned substrate is provided as shown in FIG. 6(a), the improved process 600 and methods 700, 800 may expose the patterned substrate to an etch solution 660 to etch the first dielectric material layer 620 and form recesses 670 between the metal interconnects 610, as shown in FIG. 6(b), step 720 of FIG. 7 and step 820 of FIG. 8. In some embodiments, the patterned substrate may be exposed to a non-aqueous organic-based etch solution that contains an organic solvent and an etchant chemical, which includes anions (negatively charged ions) as the main reactive species. In other embodiments, the patterned substrate may be exposed to an aqueous-based etch solution that contains an aqueous solvent and an etchant chemical, which includes cations (positively charged ions) as the main reactive species.

When the patterned substrate is exposed to an etch solution 660, as shown in FIG. 6(b), step 720 of FIG. 7 and step 820 of FIG. 8, portions of the first dielectric material layer 620 arranged between the metal interconnects 610 are removed at a faster rate (i.e., a faster etch rate) than the first dielectric material layer 620 is removed in surrounding areas 660 of the patterned substrate. The increase in etch rate between the metal interconnects 610 is due, at least in part, to the critical dimension ($CD_1$) between the metal interconnects 610 compared to the surrounding areas 650 of the patterned substrate.

As shown in FIG. 6(a), for example, a critical dimension ($CD_1$) between the metal interconnects 610 may be relatively small compared to surrounding areas 650 of the patterned substrate ($CD_2$). Because the CD ($CD_1$) between the metal interconnects 610 is smaller than the surrounding areas 650 of the patterned substrate, the etch solution 660 removes the first dielectric material layer 620 faster between the metal interconnects 610 than in the surrounding areas 650, as shown in FIG. 6(c). The faster etch rate between the metal interconnects 610 forms recesses 670 between the metal interconnects 610 having a recess depth ($D_2$), which is greater than the etch depth ($D_1$) achieved in the surrounding areas 650.

The wet etch process continues etching the first dielectric material layer 620 with the etch solution 660 until the recesses 670 reach a target recess depth ($D_T$), as shown in FIG. 6(d), step 730 of FIG. 7 and step 830 of FIG. 8. As used herein, the "target recess depth" is substantially equal to the height or thickness of the metal interconnects 610, as shown in FIG. 6(d). Due to the faster etch rate achieved between the metal interconnects 610, the recesses 670 reach the target recess depth ($D_T$) before the surrounding areas 650 are etched to the same depth. By stopping the wet etch process when the recesses 670 reach the target recess depth ($D_T$), the improved process 600 and methods 700, 800 described herein completely remove the portions of the first dielectric material layer 620 arranged between the metal interconnects 610, while retaining a certain thickness (T) of the first dielectric material layer 620 in the surrounding areas 650 of the patterned substrate.

The wet etch process shown in FIGS. 6(b)-(d) may utilize a wide variety of etch solutions. For example, a non-aqueous organic-based etch solution or an aqueous-based etch solution may be used to etch the first dielectric material layer 620 and form the recesses 670 between the metal interconnects 610. The particular etch solution 660 used within the wet etch process may be chosen based on a variety of factors, including but not limited to, the desired etch rate of the first dielectric material layer 620, the critical dimension ($CD_1$) between the metal interconnects 610 and the surface potential of the wall material adjacent to the dielectric material layer being etched when the wall material is exposed to aqueous solutions at certain pH.

As noted above, metal interconnects 610 may include a conductive metal core (e.g., a Cu core), which may be surrounded by one or more layers (such as, e.g., a barrier layer and/or a liner layer). In some embodiments, a wall material of the conductive metal core (or the barrier/liner layer surrounding the conductive metal core) may exhibit a negative surface potential when exposed to aqueous solutions at certain pH. In some embodiments, the negative surface potential of the wall material may affect the etch rate of the dielectric material layer being etched, depending on the etch solution used to etch the dielectric material layer.

In some embodiments, the wet etch process shown in FIGS. 6(b)-(d) may form recesses 670 between the metal interconnects 610 by using a non-aqueous organic-based etch solution containing an organic solvent and an etchant chemical, which includes anions (negatively charged ions) as the main reactive species. Examples of organic solvents and etchant chemicals containing anions as the main reactive species are listed above. When the patterned substrate is exposed to a non-aqueous organic-based etch solution containing anions as the main reactive species, the non-aqueous organic-based etch solution may cause exposed portions of the wall material to exhibit a positive surface potential, which attracts the anions within the etchant chemical. This attraction may increase the local concentration of anions within the recesses 670, which in turn, may increase the etch rate of the portions of the first dielectric material layer 620 arranged between the metal interconnects 610 compared to the etch rate of the first dielectric material layer 620 in the surrounding areas 650 of the patterned substrate.

In other embodiments, the wet etch process shown in FIGS. 6(b)-(d) may use an aqueous-based etch solution containing an aqueous solvent (i.e., water) and an etchant chemical, which includes cations (positively charged ions) as the main reactive species, to form the recesses 670 between the metal interconnects 610. When the patterned substrate is exposed to an aqueous-based etch solution containing cations as the main reactive species, the aqueous-based etch solution may cause exposed portions of the wall material to exhibit a negative surface potential, which attracts the cations within the etchant chemical. This attraction may increase the local concentration of cations within the recesses 670, which in turn, may increase the etch rate of the portions of the first dielectric material layer 620 arranged between the metal interconnects 610 compared to the etch rate of the first dielectric material layer 610 in the surrounding areas 660 of the patterned substrate.

The wet etch process shown in FIGS. 6(b)-(d) utilizes an etch solution 660 (e.g., a non-aqueous organic-based etch solution containing anions as the main reactive species or an aqueous-based etch containing cations as a main reactive species) that provides a faster etch rate between the metal interconnects 610 than the surrounding areas 650 of the patterned substrate. In doing so, the wet etch process shown in FIGS. 6(b)-(d) enables recesses 670 to be formed to a target recess depth ($D_T$), while retaining a certain thickness (T) of the first dielectric material layer 620 in surrounding areas 650 of the patterned substrate.

The above-mentioned etch solutions provide a faster etch rate between the metal interconnects 610 than the surrounding areas 650 of the patterned substrate when the material being etched (e.g., the first dielectric material layer 620) is adjacent to a wall material that exhibits a negative surface charge when exposed to aqueous solutions of certain pH. However, the etch solution 660 is not strictly limited to the example etch solutions described above. When the material being etched (e.g., the first dielectric material layer 620) is adjacent to a wall material that exhibits a positive surface charge in aqueous solutions of certain pH, an alternative etch solution 660 may be used to provide a faster etch rate between the metal interconnects 610 than the surrounding areas 650 of the patterned substrate. For example, when the wall surface is positively charged in aqueous solutions, the etch solution 660 may alternatively include: (a) an aqueous-based etch solution or a non-aqueous organic-based etch solution containing anions as the main reactive species, or (b) an aqueous-based etch solution containing cations as the main reactive species. In some embodiments, the pH of the etch solution 660 may be adjusted and/or a surfactant may be added to the etch solution 660 to change the surface potential of the wall material adjacent to the material being etched and provide the desired CD-dependent etch results.

After the wet etch process shown in FIGS. 6(b)-(d) is used to form recesses 670 to the target recess depth ($D_T$), the improved process 600 and methods 700, 800 may deposit a second dielectric material layer 680 on the patterned substrate to close (or "pinch off") the recesses 670 and form air gaps 690 between the metal interconnects 610, as shown in FIG. 6(e), step 740 of FIG. 7 and step 840 of FIG. 8. In some embodiments, the second dielectric material layer 680 may be planarized to provide a second planarized surface 685, as shown in FIG. 6(f), before an air gap liner 695 is deposited on the second planarized surface 685, as further shown in FIG. 6(g). The second dielectric material layer 680 and the air gap liner 695 may be deposited in FIGS. 6(e) and 6(g) using a wide variety of well-known deposition techniques. For example, the second dielectric material layer 680 and the air gap liner 695 may be deposited by spin-on, chemical vapor deposition (CVD), physical vapor deposition (PVD), etc.

The process steps shown in FIGS. 6(a)-(g) may be generally used to form air gaps 690 between two or more of the metal interconnects 610 formed within a first metal layer. In some embodiments, the process steps shown in FIGS. 6(a)-(g) may be repeated one or more times to form air gaps 690 between metal interconnects 610 formed within one or more subsequently formed metal layers overlying the first metal layer. For example, FIG. 6(h) illustrates the formation of air gaps 690 between metal interconnects formed within a second metal layer overlying the first metal layer. In some embodiments, the process steps shown in FIGS. 6(a)-(g) may be repeated a number of times to form air gaps 690 within a plurality of metal layers, which are stacked one on top of the other to form a multilayer interconnect structure.

The improved process flow 600 and methods 700, 800 disclosed herein may generally be used to form air gaps 690 between metal interconnects 610 formed within one or more metal layers of a patterned substrate. Unlike conventional air gap integration techniques, which utilize a combination of hard mask patterning, dry etch and wet etch processes to form recesses between the metal interconnects, the improved process 600 and methods 700, 800 described herein utilize an all-in-one wet etch process in FIGS. 6(b)-(d) to form the recesses 670 between the metal interconnects 610. As noted above, the wet etch process shown in FIGS. 6(b)-(d) uses an etch solution 660 to completely remove the dielectric material arranged between the metal interconnects 610, while retaining at least a portion of the dielectric material in surrounding areas 650 of the patterned substrate. By utilizing a wet etch process, as shown in FIGS. 6(b)-(d), the improved process 600 and methods 700, 800 described herein form recesses 670 between the metal interconnects 610 without using a dry etch process. By avoiding a dry etch process, the improved process 600 and methods 700, 800: (a) reduce the number of processing steps needed to form the recesses 670 between the metal interconnects 610, (b) avoid damage to the metal interconnects 610 and the dielectric material layers 620, 680, and (c) maintain mechanical integrity of the air gap interconnects formed within the multilayer interconnect structure. As a result, the improved process 600 and methods 700, 800 described herein provide several advantages over conventional air gap integration techniques.

As used herein, the term "substrate" means and includes a base material or construction upon which materials are formed. The substrate may include any material portion or structure of a device (particularly a semiconductor or other electronics device), and may, for example, be a base substrate structure (such as a semiconductor substrate) or a layer on or overlying a base substrate structure (such as a thin film). Thus, the term "substrate" is not intended to be limited to any particular base structure, underlying layer or overlying layer, patterned layer or unpatterned layer. Rather, the term "substrate" is contemplated to include any such layer or base structure, and any combination of layers and/or base structures.

It will be appreciated that the substrate described herein may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures, features or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

It is noted that reference throughout this specification to "one embodiment" or "an embodiment" means that a particular feature, structure, material or characteristic described in connection with the embodiment is included in at least one embodiment of the invention, but does not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

One skilled in the relevant art will recognize that the various embodiments described herein may be practiced without one or more of the specific details, or with other replacement and/or additional methods, materials or components. In other instances, well-known structures, materials or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the processes and methods described herein will be apparent to those skilled in the art in view of this description. It will be recognized, therefore, that the described processes and methods are not limited by the examples described herein. It is to be understood that the forms of the processes and methods described herein are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method to form air gaps between metal interconnects, the method comprising:
   providing a patterned substrate having a plurality of metal interconnects formed within a first dielectric material layer, wherein a critical dimension (CD) between the metal interconnects is small compared to surrounding areas of the patterned substrate;
   exposing the patterned substrate to an etch solution to etch the first dielectric material layer and form recesses between the plurality of metal interconnects, wherein said etching removes portions of the first dielectric material layer arranged between the plurality of metal interconnects at a faster etch rate than the first dielectric material layer is removed in the surrounding areas of the patterned substrate;

continuing etching the first dielectric material layer with the etch solution until the recesses formed between the plurality of metal interconnects reach a target recess depth; and depositing a second dielectric material layer on the patterned substrate, wherein said depositing closes the recesses formed between the plurality of metal interconnects to form air gaps between the plurality of metal interconnects.

2. The method of claim 1, wherein prior to exposing the patterned substrate, the method further comprises planarizing the patterned substrate to expose the plurality of metal interconnects and provide the first dielectric material layer with a planarized surface.

3. The method of claim 1, wherein after depositing the second dielectric material layer on the patterned substrate, the method further comprises planarizing the second dielectric material layer to provide a planarized surface and depositing an air gap liner on the planarized surface.

4. The method of claim 1, wherein said continuing etching the first dielectric material layer with the etch solution completely removes the portions of the first dielectric material layer arranged between the plurality of metal interconnects, while retaining a thickness of the first dielectric material layer in the surrounding areas of the patterned substrate.

5. The method of claim 1, wherein the etch solution is a non-aqueous organic-based etch solution that includes an etchant chemical and an organic solvent.

6. The method of claim 5, wherein the etchant chemical comprises one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

7. The method of claim 5, wherein the organic solvent comprises one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

8. The method of claim 1, wherein a wall material of the plurality of metal interconnects exhibits a negative surface potential when exposed to aqueous solutions at certain pH.

9. The method of claim 1, wherein said exposing the patterned substrate to the etch solution comprises exposing the patterned substrate to a non-aqueous organic-based etch solution that includes an etchant chemical and an organic solvent, and wherein the etchant chemical comprises anions as a main reactive species.

10. The method of claim 9, wherein said exposing the patterned substrate to the non-aqueous organic-based etch solution increases an etch rate of the portions of the first dielectric material layer arranged between the plurality of metal interconnects compared to an etch rate of the first dielectric material layer in the surrounding areas of the patterned substrate.

11. The method of claim 8, wherein said exposing the patterned substrate to the etch solution comprises exposing the patterned substrate to an aqueous-based etch solution that includes an etchant chemical and an aqueous solvent, and wherein the etchant chemical comprises cations as a main reactive species.

12. The method of claim 11, wherein said exposing the patterned substrate to the aqueous-based etch solution increases an etch rate of the portions of the first dielectric material layer arranged between the plurality of metal interconnects compared to an etch rate of the first dielectric material layer in the surrounding areas of the patterned substrate.

13. The method of claim 1, wherein a wall material of the plurality of metal interconnects exhibits a positive surface potential when exposed to aqueous solutions at certain pH.

14. The method of claim 13, wherein said exposing the patterned substrate to the etch solution comprises exposing the patterned substrate to an aqueous-based etch solution that includes an etchant chemical and an aqueous solvent, or a non-aqueous organic-based etch solution that includes the etchant chemical and an organic solvent.

15. The method of claim 14, wherein said exposing the patterned substrate to the etch solution comprises:

exposing the patterned substrate to the aqueous-based etch solution or the non-aqueous organic-based etch solution when the etchant chemical comprises anions as a main reactive species; and exposing the patterned substrate to the aqueous-based etch solution when the etchant chemical comprises cations as a main reactive species.

16. The method of claim 14, wherein said exposing the patterned substrate to the aqueous-based etch solution or the non-aqueous organic-based etch solution increases an etch rate of the portions of the first dielectric material layer arranged between the plurality of metal interconnects compared to an etch rate of the first dielectric material layer in the surrounding areas of the patterned substrate.

17. The method of claim 1, wherein the recesses formed between the plurality of metal interconnects reach the target recess depth without using a dry etch process.

18. A method to form air gaps between metal interconnects, the method comprising:

providing a patterned substrate having a plurality of metal interconnects formed within a first dielectric material layer, wherein a critical dimension (CD) between the metal interconnects is small compared to surrounding areas of the patterned substrate;

exposing the patterned substrate to a non-aqueous organic-based etch solution to etch the first dielectric material layer and form recesses between the plurality of metal interconnects, wherein the non-aqueous organic-based etch solution etches portions of the first dielectric material layer arranged between the plurality of metal interconnects faster than the first dielectric material layer is etched in the surrounding areas of the patterned substrate;

continuing etching the first dielectric material layer with the non-aqueous organic-based etch solution until the recesses formed between the plurality of metal interconnects reach a target recess depth; and depositing a second dielectric material layer on the patterned substrate, wherein said depositing closes the recesses formed between the plurality of metal interconnects to form air gaps between the plurality of metal interconnects.

19. The method of claim 18, wherein said continuing etching the first dielectric material layer with the non-aqueous organic-based etch solution completely removes the portions of the first dielectric material layer arranged between the plurality of metal interconnects, while retaining a thickness of the first dielectric material layer in the surrounding areas of the patterned substrate.

20. The method of claim 18, wherein the non-aqueous organic-based etch solution includes an etchant chemical and an organic solvent.

21. The method of claim 20, wherein the etchant chemical comprises one or more of hydrofluoric acid (HF), ammonium hydroxide ($NH_4OH$), hydrochloric acid (HCl), hydrogen peroxide ($H_2O_2$), nitric acid ($HNO_3$), phosphoric acid ($H_3PO_4$), potassium hydroxide (KOH) and Tetramethylammonium hydroxide (TMAH).

22. The method of claim 20, wherein the organic solvent comprises one or more of methanol ($CH_4O$), ethanol ($C_2H_6O$), isopropyl alcohol ($C_3H_8O$), benzyl alcohol ($C_7H_8O$), ethylene glycol ($C_2H_6O_2$), acetic acid ($CH_3COOH$), acetone ($C_3H_6O$), propylene carbonate ($C_4H_6O_3$), n-hexane ($C_6H_{14}$), cyclohexane ($C_6H_{12}$), diethyl ether ($C_4H_{10}O$), tetrahydrofuran ($C_4H_8O$), benzene ($C_6H_6$), toluene ($C_7H_8$), dichloromethane ($CH_2Cl_2$), trichloroethylene ($C_2HCl_3$), 1,1,1-trichloroethane ($C_2H_3Cl_3$), 1,2-dichloroethane ($C_2H_4Cl_2$), N-methyl-2-pyrrolidone ($C_5H_9NO$), dimethyl sulfoxide ($C_2H_6OS$), ethyl lactate ($C_5H_{10}O_3$), ethanolamine ($C_2H_7NO$) and propylene glycol methyl ether acetate ($C_6H_{12}O_3$).

23. The method of claim 20, wherein a wall material of the plurality of metal interconnects exhibits a negative surface potential when exposed to aqueous solutions at certain pH, wherein the etchant chemical comprises an anion as a main reactive species, and wherein said exposing the patterned substrate to the non-aqueous organic-based etch solution increases an etch rate of the portions of the first dielectric material layer arranged between the plurality of metal interconnects compared to an etch rate of the first dielectric material layer in the surrounding areas of the patterned substrate.

24. The method of claim 18, wherein the recesses formed between the plurality of metal interconnects reach the target recess depth without using a dry etch process.

* * * * *